(12) United States Patent
Upadhya et al.

(10) Patent No.: US 11,546,202 B2
(45) Date of Patent: Jan. 3, 2023

(54) RADIO FREQUENCY TRANSMISSION

(71) Applicant: NOKIA SOLUTIONS AND NETWORKS OY, Espoo (FI)

(72) Inventors: Karthik Upadhya, Espoo (FI); Stefan Wesemann, Kornwestheim (DE)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 31 days.

(21) Appl. No.: 17/183,772

(22) Filed: Feb. 24, 2021

(65) Prior Publication Data

US 2021/0273841 A1  Sep. 2, 2021

(30) Foreign Application Priority Data

Mar. 2, 2020  (EP) .................................... 20160345

(51) Int. Cl.
*H04L 27/34* (2006.01)
*H03F 3/24* (2006.01)
*H04B 1/04* (2006.01)

(52) U.S. Cl.
CPC ......... *H04L 27/3483* (2013.01); *H03F 3/245* (2013.01); *H04B 1/04* (2013.01); *H03F 2200/451* (2013.01); *H04B 2001/0408* (2013.01)

(58) Field of Classification Search
CPC .............. H04L 27/3483; H04B 1/04; H04B 2001/0408; H03F 2200/451; H03F 3/245
See application file for complete search history.

(56) References Cited

U.S. PATENT DOCUMENTS 9,197,241 B2   11/2015  Liu
10,193,508 B2   1/2019  Baneijee et al.
2010/0074367 A1   3/2010  Kim et al.
2015/0180692 A1   6/2015  Hezar et al.
2020/0403573 A1*  12/2020  Rofougaran ............. H03F 3/19

FOREIGN PATENT DOCUMENTS

WO    WO 01/91282 A2    11/2001
WO    WO 2008/147908 A1  12/2008

OTHER PUBLICATIONS

Extended European Search Report for European Application No. 20160345.3 dated Aug. 7, 2020, 7 pages.
Godoy, P., "Techniques for high-efficiency outphasing power amplifiers", Doctoral dissertation, Massachusetts Institute of Technology, (Sep. 2011), 177 pages.
Jacobsson et al., "On out-of-band emissions of quantized precoding in massive MU-MIMO-OFDM," 2017 51st Asilomar Conference on Signals, Systems, and Computers, Pacific Grove, CA, (Dec. 4, 2017), pp. 21-26.
Nedelcu et al., "Quantized Precoding for Multi-Antenna Downlink Channels with MAGIQ," WSA 2018; 22nd International ITG Workshop on Smart Antennas, Bochum, Germany, (Mar. 14-16, 2018), pp. 1-8.
Office Action for European Application No. 20160345.3 dated Mar. 22, 2022, 6 pages.

* cited by examiner

*Primary Examiner* — Rahel Guarino
(74) *Attorney, Agent, or Firm* — Alston & Bird LLP

(57) ABSTRACT

An apparatus is provided that includes circuitry for decomposing an input signal to multiple substantially constant-envelope components and an outphasing path for each substantially constant-envelope component. The apparatus also includes a modulator for discrete phase control in each outphasing path, an amplifier in each outphasing path and a combiner for combining output signals from the outphasing paths. A system and method are also provided.

20 Claims, 5 Drawing Sheets

$S = S1 + S2$

• constellation point 142

RADIO FREQUENCY TRANSMISSION

CROSS-REFERENCE TO RELATED APPLICATIONS

This application claims priority to European Patent Application No. 20160345.3, filed Mar. 2, 2020, the entire contents of which are incorporated herein by reference.

TECHNOLOGICAL FIELD

Embodiments of the present disclosure relate to radio frequency transmission.

BACKGROUND

In order for radio signals to be transmitted over distances it is necessary for them to be amplified before transmission. Power amplifiers are typically used for this purpose. It can be desirable for the power amplifiers to amplify the signal linearly so that non-linear distortions are not created in the amplified signal.

However, linear amplifiers are inefficient and can be expensive.

BRIEF SUMMARY

According to various, but not necessarily all, embodiments there is provided an apparatus comprising:
 means for decomposing an input signal to multiple substantially constant-envelope components;
 an outphasing path for each substantially constant-envelope component;
 means for discrete phase control in each outphasing path;
 an amplifier in each outphasing path; and
 means for combining output signals from the outphasing paths.

In some but not necessarily all examples, the means for discrete phase control in each outphasing path is configured to define, for the outphasing path, a constellation point in a constant envelope constellation diagram.

In some but not necessarily all examples, the apparatus comprises means for providing discrete phase control in each outphasing path to define, for each outphasing path, a constellation point in the constant envelope constellation diagram and thereby define a target constellation point in the non-constant-envelope constellation diagram for the output signal.

In some but not necessarily all examples, each outphasing path comprises a phase controller that enables discrete phase control in the outphasing path, wherein the phase controller is configured to phase modulate a carrier wave.

In some but not necessarily all examples, the amplifier in each outphasing path is a non-linear amplifier configured for amplification of the substantially constant-envelope component received by the outphasing path.

In some but not necessarily all examples, the apparatus comprises means for providing the combined output signals of the outphasing paths to an antenna for transmission.

In some but not necessarily all examples, a system comprises for each one of a plurality of antennas, the apparatus.

In some but not necessarily all examples, the system comprises means for controlling, for each antenna, discrete phase control in each outphasing path to define, for each outphasing path, a constellation point in a constant envelope constellation diagram and thereby define a target constellation point in a non-constant-envelope constellation diagram for each of the combined output signals provided to each of the antennas.

In some but not necessarily all examples, the means for decomposing an input signal to multiple substantially constant-envelope components is configured to decompose the input signal to multiple substantially constant-envelope components for all antennas.

In some but not necessarily all examples, the system comprises means for optimizing a cost function, across the plurality of antennas, to determine discrete phase control used for each outphasing path.

In some but not necessarily all examples, the cost function is dependent upon total transmission power of the plurality of antennas and a measure of a difference between information intended to be received and information estimated to be received, as a consequence of providing the respective combined output signals of the outphasing paths to a respective antenna for transmission.

In some but not necessarily all examples, the cost function is dependent upon efficiency, for example, power efficiency of the transmitter such as power added efficiency of the amplifier used.

In some but not necessarily all examples, the cost function is additionally dependent upon interference, for example out of band transmission.

In some but not necessarily all examples, a base station comprises the system.

According to various, but not necessarily all, embodiments there is provided a method comprising:
 decomposing an input signal to multiple substantially constant-envelope components;
 providing for each substantially constant-envelope component, discrete phase control and amplification
 combining the substantially constant-envelope components after separate discrete phase control and amplification.

According to various, but not necessarily all, embodiments there is provided an apparatus comprising:
 decomposing means for decomposing an input signal to multiple substantially constant-envelope components;
 an outphasing path for each substantially constant-envelope component;
 means for discrete phase control in each outphasing path;
 an amplifier in each outphasing path; and
 a combiner for each of a plurality of antennas, wherein each combiner combines different output signals from outphasing paths to provide an antenna input signal for a respective antenna.

In some but not necessarily all examples, the decomposing means for decomposing is configured to provide for joint spatial precoding and outphasing decomposition.

In some but not necessarily all examples, each antenna input signal for a respective antenna defines a constellation point.

In some but not necessarily all examples, the means for providing discrete phase control in each outphasing path is configured to define, for each outphasing path associated with an antenna, a constellation point in a constant envelope constellation diagram and thereby define a target constellation point in a non-constant-envelope constellation diagram for the input signal for the antenna.

In some but not necessarily all examples, the transmitted signals from each antenna are combined over the air to generate a symbol of the input signal at a receiver.

According to various, but not necessarily all, embodiments there is provided examples as claimed in the appended claims.

BRIEF DESCRIPTION

Some example embodiments will now be described with reference to the accompanying drawings in which.

DETAILED DESCRIPTION

Figure 1:
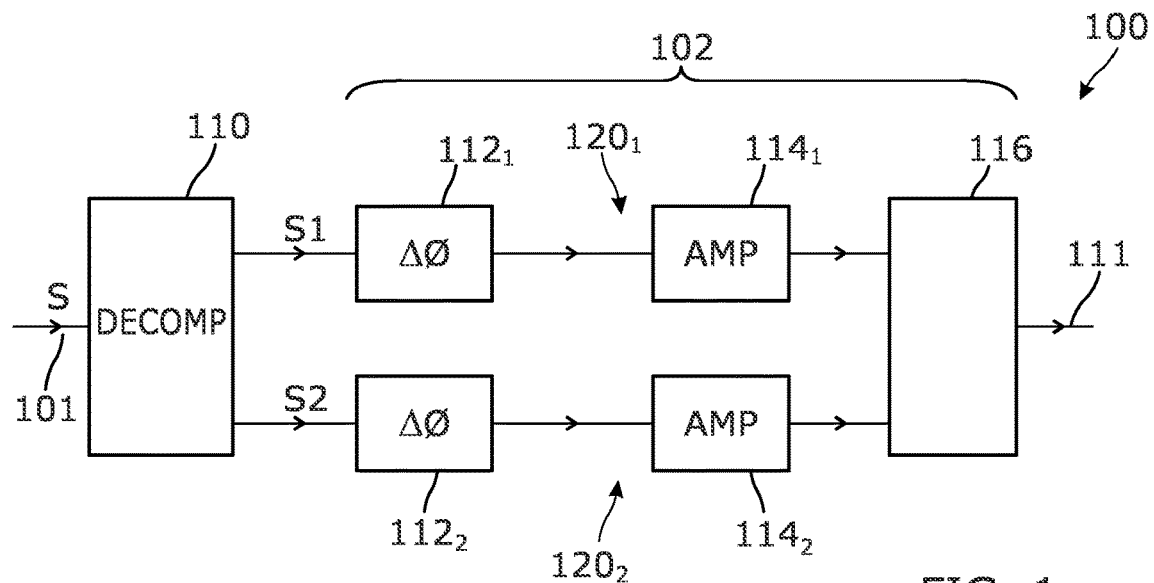
FIG. 1 shows an example embodiment of the subject matter described herein.

The following Figures disclose various examples of an apparatus 100, system 200 or base station 300 comprising:

decomposing means 110 for decomposing an input signal 101 to multiple substantially constant-envelope components S1, S2;

an outphasing path $120_n$ for each substantially constant-envelope component Sn;

discrete phase control means $112_n$ for discrete phase control in each outphasing path $120_n$;

an amplifier $114_n$ in each outphasing path $120_n$; and combining means 116 for combining output signals from the outphasing paths $120_n$. The term 'decompose' (and similar terms such as, for example, 'decomposition', 'decomposing' etc) is used in its normal mathematical sense to mean separation into component parts. It is not intended to have or connote an implied specific technical meaning, or be limited to application in a specific field or domain such as digital/analogue or linear/non-linear.

The decomposing described is used for outphasing and can therefore be described as outphasing decomposition. In some examples, described later, non-linear precoding provides for joint (spatial) precoding and outphasing decomposition. The joint (spatial) precoding allows use of discrete phase control (instead of continuous phase control) to control each transmit antenna to transmit a constellation point (rather than a symbol). The signals from each antenna are then combined over the air to generate the symbol at the receiver. Thus in at least some examples, decomposition is achieved by joint (spatial) precoding and outphasing-decomposition.

FIG. 1 illustrates an example of an apparatus 100 comprising:

decomposing means 110 for decomposing an input signal 101 to multiple substantially constant-envelope components S1, S2;

an outphasing path $120_n$ for each substantially constant-envelope component Sn;

discrete phase control means $112_n$ for discrete phase control in each outphasing path $120_n$;

an amplifier $114_n$ in each outphasing path $120_n$; and combining means 116 for combining output signals from the outphasing paths $120_n$.

In the example illustrated the apparatus 100 comprises:

decomposing means 110 for decomposing an input signal 101 to two substantially constant-envelope components S1, S2 per transmit antenna;

a first outphasing path $120_1$, for a first substantially constant-envelope component S1, comprising first discrete phase control means $112_1$ for discrete phase control in the first outphasing path $120_1$ and a first amplifier $114_1$ in the first outphasing path $120_1$; a second outphasing path $120_2$, for a second substantially constant-envelope component S2, comprising second discrete phase control means $112_2$ for discrete phase control in the second outphasing path $120_2$ and a second amplifier $114_2$ in the second outphasing path $120_2$; and combining means 116 for combining an output signal from the first outphasing path $120_1$ and an output signal from the second outphasing path $120_2$.

In this example, the decomposing means 110 decomposes an input signal 101 to two substantially constant-envelope components S1, S2 per transmit antenna. There are two outphasing paths $120_1$, $120_2$ per transmit antenna, the outputs of which are combined by the combining means 116. However, in other examples, the decomposing means 110 decomposes an input signal 101 to M (M≥2) substantially constant-envelope components S1, S2 ... SM per transmit antenna and there are M outphasing paths $120_1$, $120_2$ ... $120_M$ per transmit antenna the outputs of which are combined by the combining means 116 for transmission by a transmit antenna.

Circuitry 102 is outphasing transmit chain circuitry. In this example the outphasing transmit chain circuitry 102 comprises one outphasing branch per transmit antenna. In this example, the outphasing branch comprises multiple (two in this example) outphasing paths $120_n$ and combining means 116. Each outphasing path $120_n$ provides for discrete phase control (discrete phase control means $112_n$) and for magnitude control (amplifier $114_n$). In the example illustrated the discrete phase control means $112_n$ and amplifier $114_n$ are illustrated as series connected in a particular order. This order can, however, be reversed.

Each outphasing path $120_n$ provides linear amplification, even when the amplifiers $114_n$ in the outphasing paths $120_n$ are non-linear. The apparatus 100 can therefore achieve linear amplification using cheaper and more energy efficient non-linear amplifiers rather than using linear amplifiers.

The amplifier $114_n$ in each outphasing path $120_n$ is configured for linear amplification of the substantially constant-envelope component Sn received by the outphasing path $120_n$. In some examples, the amplifiers $114_n$ are non-linear power amplifiers. In some examples, the same non-linear amplifier $114_n$ is used in each outphasing path $120_n$. In some examples, the non-linear amplifiers $114_n$ are class E or class F.

The apparatus can be any suitable transmitter or transceiver. It can, for example, be a network node such as a base station, for example a cellular base station e.g. node-B in 3GPP, or can be a terminal, for example a cellular terminal e.g. mobile equipment (ME) or user equipment (UE) in 3GPP.

Figure 2:
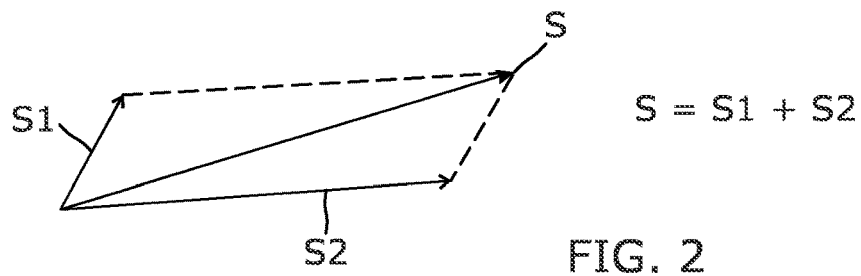
FIG. 2 shows another example embodiment of the subject matter described herein.

As illustrated in FIG. 2, the signal S, to be amplified, is decomposed into multiple substantially constant envelope signals S1, S2 such that their vector sum would substantially reproduce the original signal S (S=S1+S2). As the decomposed signals S1, S2 are substantially constant envelope they can be amplified at the substantially constant envelope value in a linear fashion by the amplifier $114_n$ even if the amplifier $114_n$ has non-linear characteristics over a larger range of magnitudes. Therefore, each amplifier $114_n$ can operate in an efficient, non-linear mode. The outputs of the multiple amplifiers $114_n$ are then summed, for example with a power combiner $116_n$ or an isolating combiner $116_n$ to produce an amplified version of the input signal as an output signal (e.g. G.S=G.S1+G.S2, where G is amplifier gain).

The sum of the multiple substantially constant-envelope components S1, S2 when transmitted enables substantial reproduction of the input signal 101 at a receiver.

The multiple amplifiers $114_n$ are constant-envelope and therefore consume a fixed amount of power.

Magnitude variation in the signal S over time can be accommodated by varying, over time, the phase (angle) between S and S1 and between S and S2 without needing to vary the magnitude of S1 or the magnitude of S2. Thus S1 and S2 are constant envelope.

A substantially constant-envelope component Sn can fluctuate only within a narrow efficiency range of operation of the amplifier $114_n$ of the outphasing path $120_n$ that receives the constant-envelope component Sn.

The term "substantially" is used to indicate that some small variation in magnitude can, in some examples, be accommodated. The term "exactly" is used to indicate that there is no variation in magnitude. The envelopes can be substantially constant or exactly constant. Where the word substantially is not explicitly used, for example some Patent Offices do not allow the term in the claims, it should be inferred.

Thus, the signal S(t) can be decomposed from a sequence of inputs $\{S(t_n)\}$ to a sequence of multiple components, each sequence of components $\{S1(t_n)\}$, $\{S2(t_n)\}$ has a constant magnitude, over time, but has a phase that can be varied discretely over the sequence.

The substantially constant-envelope components S1, S2 can be provided as substantially constant-envelope phasor components (digital domain) or substantially constant-envelope analogue signal components (analogue domain). Each outphasing path $120_n$ comprises means for:

receiving one of the multiple substantially constant-envelope components S1, S2 as substantially constant-envelope phasor components or substantially constant-envelope signal components;

modifying the received one of the multiple substantially constant-envelope components S1, S2 using a phase controller that enables discrete phase control in the outphasing path $120_n$ and an amplifier $114_n$ in the outphasing path $120_n$; and combining means 116 for combining the modified multiple substantially constant-envelope components S1, S2.

Figure 3:
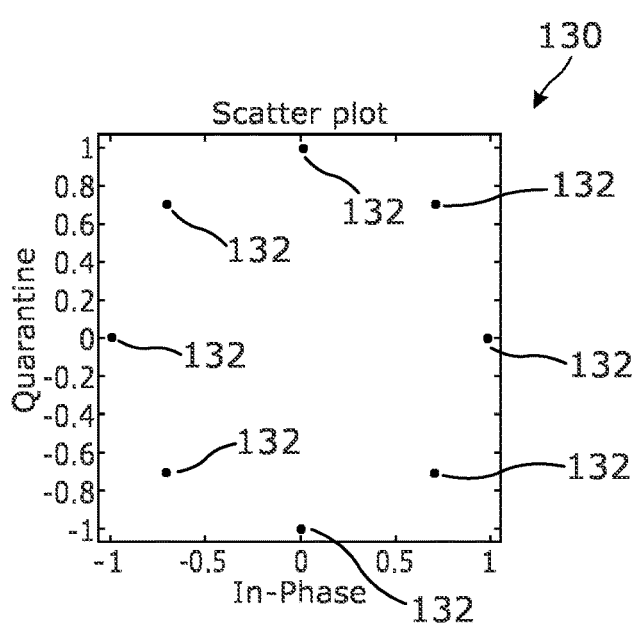
FIG. 3 shows another example embodiment of the subject matter described herein.

The discrete phase control means $112_n$ for discrete phase control in each outphasing path $120_n$ is configured to define, for the outphasing path $120_n$, a constellation point 132 in a constant-envelope constellation diagram 130. An example of a suitable constant-envelope constellation diagram 130 is illustrated in FIG. 3.

Each outphasing path $120_n$ has an associated (constant magnitude) constellation diagram 130. In some but not necessarily all examples, each outphasing path $120_n$ has the same associated (constant magnitude) constellation diagram 130.

Figure 4:
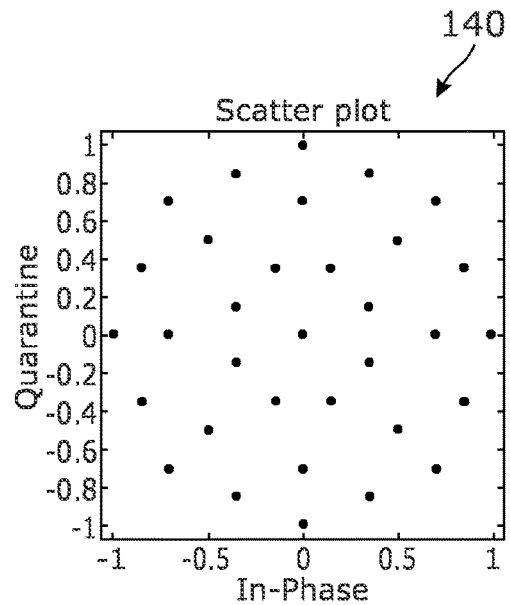
FIG. 4 shows another example embodiment of the subject matter described herein.

The combining means 116, for combining output signals from the outphasing paths $120_n$, is configured to provide, as output 111, a signal associated with a constellation point 142 in a non-constant-envelope constellation diagram 140. The combining means 116 can, for example, add the output signals from the outphasing paths $120_n$. An example of a non-constant-envelope constellation diagram 140 is illustrated in FIG. 4. The non-constant-envelope constellation diagram 140 is the constellation diagram formed by combining two signals that have the same associated constant magnitude constellation diagram 130 illustrated in FIG. 3.

The constant-envelope constellation diagram 130 is characterized by quantized phases and a fixed magnitude. The constellation points lie on a circle, centered at the origin. In this example the constellation points are evenly distributed on the circumference of that circle.

The discrete phase control means $112_n$ is configured to add a quantum of phase $2\pi.m/N$ where $0 \le m < N$ and N is the number of constant magnitude constellation points 132, for example, N can in some example equal $2^n$ where n is a natural number. In some examples, n is greater than or equal to 5. Adjacent constellation points 132 in the constant-envelope constellation diagram 130 are separated by a low resolution or quantized phase of $2\pi/N$.

The non-constant-envelope constellation diagram 140 is characterized by quantized phases and quantized magnitudes. The constellation points lie on the origin or circles of different magnitude radius, centered at the origin. In this example the constellation points 142 that are distributed on the circumferences of the circles are evenly distributed on the circumferences of the circles.

If the N constellation points 132 for S1 are defined by $\exp(2\pi.m1/N)$ and the N constellation points 132 for S2 are defined by $\exp(2\pi.m2/N)$, then the constellation points 142 for the combined signal are $\exp(2\pi.m1/N)+\exp(2\pi.m2/N)$.

The non-constant-envelope constellation diagram 140 has more constellation points 142 and a denser distribution of constellation points 142 than the constant-envelope constellation diagram 130.

The discrete phase control means $112_n$ defines, for its outphasing path $120_n$, a constellation point 132 in the constant-envelope constellation diagram 130. In combination, they define a target constellation point 142 in the non-constant-envelope constellation diagram 140 for the output signal 111.

Figure 5:
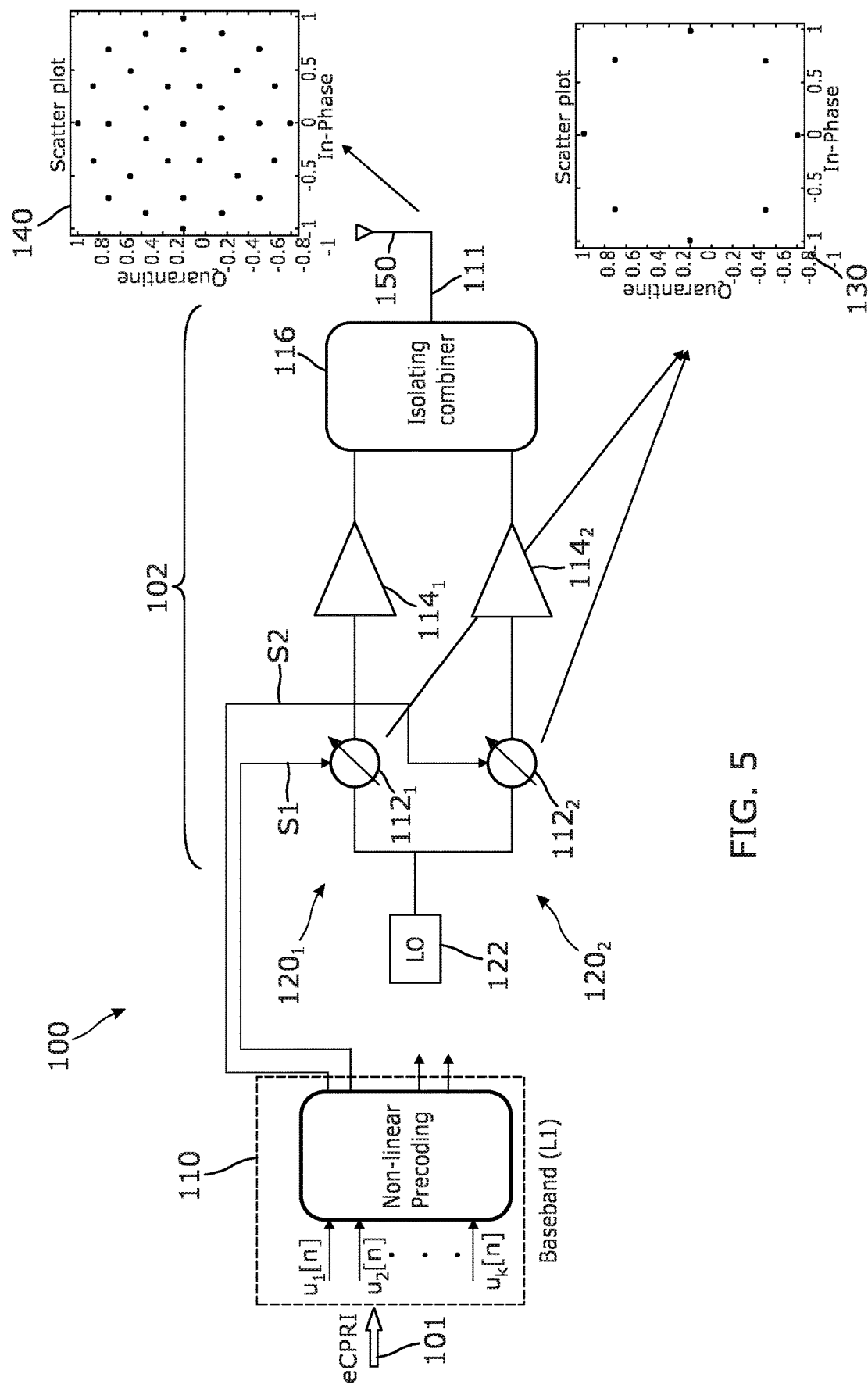
FIG. 5 shows another example embodiment of the subject matter described herein.

In FIG. 5, each outphasing path $120_n$ comprises a phase controller $112_n$ controlled by the decomposed signals S1, S2, that enables discrete phase control in the outphasing path $120_n$. The decomposition means 110 is configured to control the discrete phase control in each phase controller $112_n$.

In these examples, the phase controller $112_n$ is configured to phase modulate a carrier wave.

The carrier wave is provided by a local oscillator (LO) 122 to each of the multiple phase controllers $112_n$. The phase of the carrier wave is controlled by the phase controller $112_n$, via the decomposed signal Sn, to have a constellation point 132 in a constant envelope constellation diagram. Each phase controller $112_n$ therefore provides discrete (e.g. quantized) phase control for its outphasing path $120_n$. The signal, after discrete phase control is amplified by the respective amplifier $114_n$ of the outphasing path $120_n$. The combining means 116 combines the amplified output signals from the outphasing paths $120_n$ to produce, as output, an amplified version of the carrier wave that has a target constellation point 142 in a non-constant envelope constellation diagram 140. The combined output signal 111 of the outphasing paths $120_n$ is provided to an antenna 150 for transmission.

Circuitry 102 is outphasing transmit chain circuitry. In this example the outphasing transmit chain circuitry 102 comprises one outphasing branch per transmit antenna. In this example, each outphasing branch comprises multiple (two in this example) outphasing paths $120_n$ and comprises combining means 116.

In these examples, the signal 101 is provided via an Evolved Common Public Radio Interface (eCPRI). This is an interface specification between Radio Equipment Control (REC) and Radio Equipment (RE) of radio base stations used for cellular wireless networks. The interface can transport baseband I/Q signals to the radio equipment. Other interfaces can be used.

In this example, the combining means 116 is an isolating combiner. Other combiners can be used.

In this example, the decomposition means 110 comprises circuitry for precoding. The circuitry decomposes the input signal 101 to multiple substantially constant-envelope components Sn for multiple respective outphasing paths $120_n$.

The circuitry for precoding can provide additional phase control. For example, controlling the signals provided to the outphasing paths $120_n$ so that when the signals from the outphasing paths $120_n$ are combined by combining means 116, for all outphasing paths of all antennas, a target symbol, for example an OFDM symbol, is obtained. An OFDM symbol cannot be generated at each antenna 150 when only low-resolution phase shifters $112_n$ are used. Instead, the signals from each antenna 150 are combined 'over the air' to generate the OFDM symbol at the UE.

The (over-the-air) sum of all outphasing branches (not only the ones that are combined in a single Tx path) re-creates the wanted signal, input signal 101, in a predetermined spatial direction (i.e., beam). This multi-antenna/over-the-air combining enables the use of efficient/quantized outphasing paths and branches.

Outphasing transmit chain circuitry 102 provides, per transmit antenna 150, one outphasing branch which comprises multiple (two in this example) outphasing paths $120_n$ and combining means 116.

In some examples, there are many outphasing branches, each consisting of a plurality of outphasing paths $120_n$, a nonlinear power amplifier per outphasing path, and a single combiner. The output of each outphasing branch is a constellation point 142 from the constellation 140. The input signal 101 is decomposed such that the sum of all outphasing paths (from all outphasing branches) reconstructs the wanted signal (in a specific beam direction). In this example there are at least two outphasing branches, and at least two outphasing paths per outphasing branch, and at least four constant-envelope signals S1, S2, S3 and S4, whose superposition (over the air) resembles the input signal 101.

The decomposition means 110 serves via multiple outphasing branches respective multiple antennas 150.

In this example, the decomposition means 110 is circuitry for non-linear precoding and provides additional phase control. For example, controlling the signals provided to the outphasing paths $120_n$ to control beam-forming by the multiple antennas 150 as described above. For example, controlling the signals provided to the outphasing paths $120_n$ so that when the signals from the outphasing paths $120_n$ are combined in 116, and the resulting signals from all outphasing branches are combined over the air when transmitted by the antennas 150, a target symbol is obtained.

The discrete phase control means $112_n$, for an outphasing path $120_n$ can for example be provided by a radio frequency phase shifter, a phase-modulated phase locked loop (PLL), a base band phase shifter or a Gaussian Minimum Shift Key (GMSK) chain.

Figure 6:
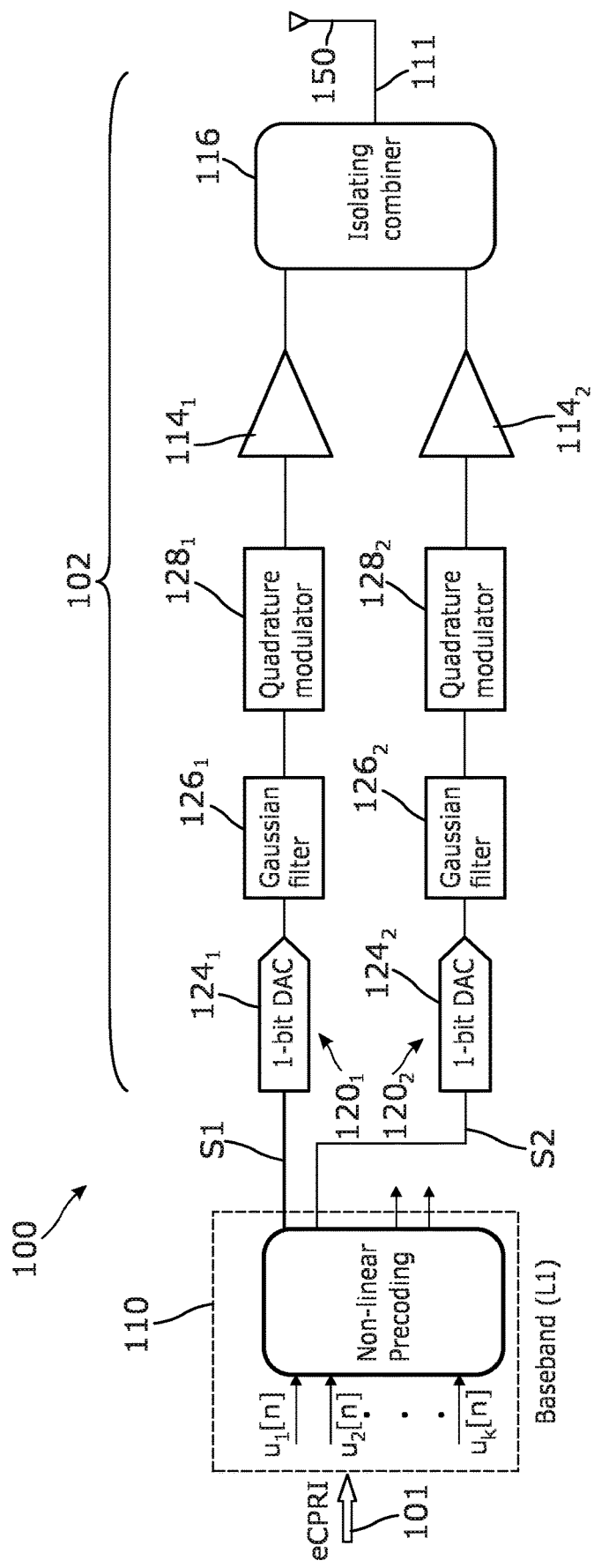
FIG. 6 shows another example embodiment of the subject matter described herein.

FIG. 6 illustrates an example in which the discrete phase control means $112_n$, for an outphasing path $120_n$ is provided by a Gaussian Minimum Shift Key (GMSK) chain comprising a digital to analogue converter $124_n$, a Gaussian filter $126_n$ and a quadrature modulator $128_n$. The quadrature modulator comprises the local oscillator and the phase controller. A single local oscillator can be shared by multiple outphasing paths. The quadrature modulator provides the discrete phase control means for discrete phase control in each outphasing path $120_n$.

Figure 7:
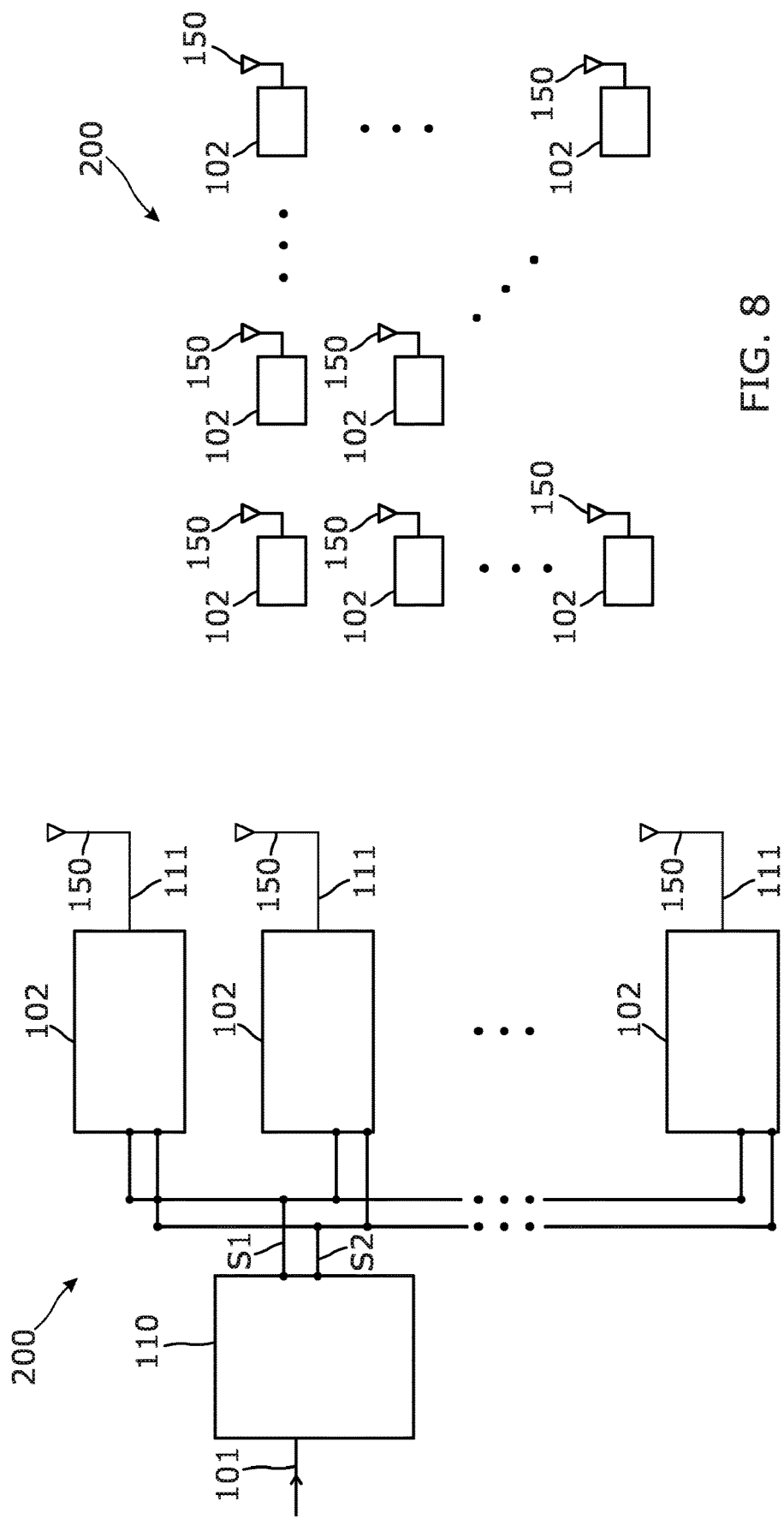
FIG. 7 shows another example embodiment of the subject matter described herein.

FIG. 7 illustrates a system 200 comprising: decomposing means 110 for decomposing an input signal 101 to multiple substantially constant-envelope components S1, S2 that is shared by multiple antennas 150.

The S1, S2 signals are generated for each antenna. So, they differ for the individual antennas.

The system 200 comprises, for each one of a plurality of antennas, an outphasing branch of outphasing transmit chain circuitry 102 comprising (as previously described) an outphasing path $120_n$ for each substantially constant-envelope component Sn. Each outphasing path $120_n$ has discrete phase control means $112_n$ for discrete phase control in each outphasing path $120_n$ and an amplifier $114_n$ in each outphasing path $120_n$ and combining means 116 for combining output signals from the outphasing paths $120_n$. The combined output signals of the outphasing paths $120_n$ are provided to a respective antenna 150 for transmission. Each outphasing path $120_n$ in the system 200 amplifies a constant-envelope component. The magnitude of the constant-envelope component, in each outphasing path $120_n$ can, in some examples be the same such that all outphasing paths $120_n$ amplify components that have the same magnitude.

The decomposing means 110 controls, for each antenna 150, discrete phase control in each outphasing path $120_n$ to define, for each outphasing path $120_n$, a constellation point 132 in a constant-envelope constellation diagram 130 and thereby define a target constellation point in a non-constant-envelope constellation diagram 140 for each of the combined output signals provided to each of the antennas 150.

The decomposing means 110 is configured to decompose the input signal 101 to multiple substantially constant-envelope components Sn jointly for all antennas 150.

Figure 8:
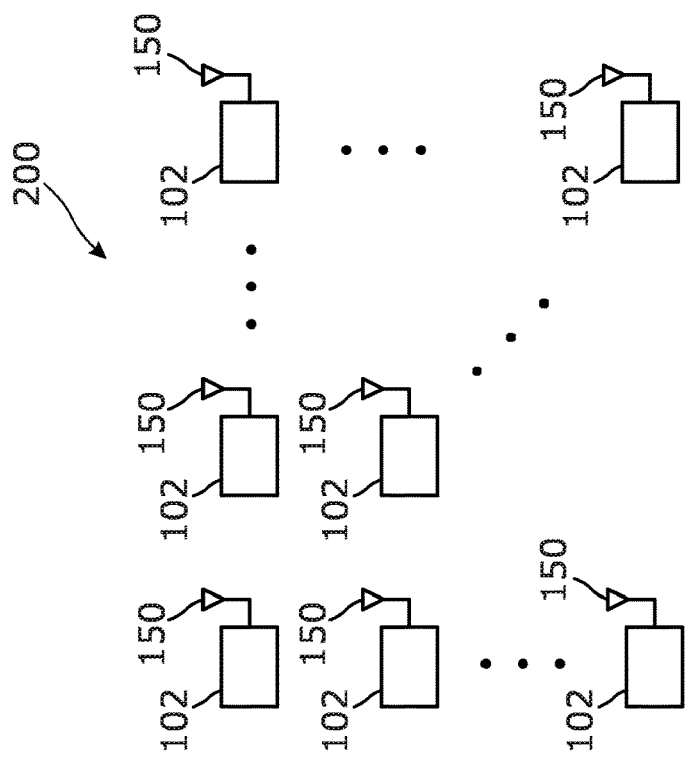
FIG. 8 shows another example embodiment of the subject matter described herein.

FIG. 8 illustrates an example of the system 200 used for beam-forming. It can, for example, be configured for massive multiple input multiple output (mMIMO).

For example, each antenna 150 is arranged in a regular array. The signal for each antenna is provided by a respective outphasing branch of outphasing transmit chain circuitry 102 as illustrated in FIG. 7.

The array can for example comprise 64*X antennas where $X=2^n$ and n=0, 1, 2, 3 . . . e.g. there can, in some examples, be 64, 128, 256, 512 . . . antennas 150 in the array.

Figure 9:
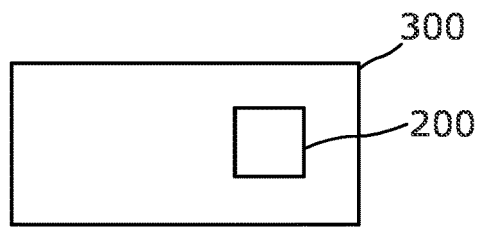
FIG. 9 shows another example embodiment of the subject matter described herein.

FIG. 9 illustrates an example of a base station 300 comprising the system 200 as previously described. The base station can be cheaper to build and cheaper to operate because less expensive and/or more power efficient amplifiers 114 can be used.

In the preceding examples, the decomposing means 110 (or some other processing component or circuitry) can be configured to optimize a cost function, across the plurality of antennas 150, to determine the discrete phase control used for each outphasing path $120_n$.

An example of a cost function is:

$$\arg\min_{\alpha>0,A} \alpha^2\|A\|_F^2 + \lambda_1 \sum_{n\in N_u} \|u[n] - \alpha H[n]x[n]\|^2 + \lambda_2 \sum_{n\notin N_u} \|Af_n\|^2 + I_{\{eff(A)\geq \eta\}}$$

subject to $[A]_{(m,n)} \in \chi$ $x[n] = Af_n \forall n \in \mathcal{N}_u$

Where $f_n$ is the $n^{th}$ column of the DFT matrix, N×N DFT matrix has element (m,n) equal to $$\exp\left\{-\frac{j2\pi(m-1)(n-1)}{N}\right\}.$$

$I_{(eff(A) \geq \eta)}$ is the indicator function defined, for example, as $$I_{\{eff(A) \geq \eta\}} = \begin{cases} \infty, & eff(A) < \eta \\ 0, & eff(A) \geq \eta \end{cases}$$

$A \in \mathbb{C}^{M \times N}$ is the time-domain signal across all antennas,
$H[n]$ is the channel matrix at subcarrier n
M and N correspond to the number of antennas and the FFT size,
$N_u$ is the index of used subcarriers,
$\chi$ is the constellation resulting from the low-resolution phase-shifters
The constraint $$eff(A) = \frac{<p_{out}>}{p_{max}} = \frac{\|A\|_F^2}{MN}$$

constrains the efficiency of the outphasing architecture, so that an efficiency of at least η is achieved.

In this example the cost function is dependent upon total transmission power of the plurality of antennas. In the example cost function above, the dependency upon total transmission power is provided by:

$$\arg\min_{\alpha > 0, A} \alpha^2 \|A\|_F^2$$

In this example the cost function is dependent upon a measure of a difference between information intended to be received and information estimated to be received, as a consequence of providing the respective combined output signals of the outphasing paths 120n to a respective antenna for transmission.

The measure of difference can, for example, be signal noise and distortion ratio (SNDR) or error vector magnitude (EVM) that quantify a precision of the generated signal. SNDR is a ratio of the total signal power level (Signal+Noise+Distortion) to unwanted signal power (Noise+Distortion).

In the example cost function above, a measure of difference is provided by a squared difference between the information intended to be received u[n] and the information estimated to be received αH[n]x[n], summed over all antennas:

$$\sum_{n \in N_u} \|u[n] - \alpha H[n]x[n]\|^2$$

In this example cost function, there is a constellation constraint in that the phase control can be quantized in a predetermined manner. In the example cost function above, optimization of the cost function is subject to the constraint $[A]_{(m,n)} \in \chi$ The cost function can, in some examples, be dependent upon efficiency. For example, there may be a requirement for efficiency to be above a threshold value.

In the example cost function above, the dependence upon efficiency is provided by:

$I_{\{eff(A) \geq \eta\}}$

The cost function can, in some examples, be additionally dependent upon interference, for example out of band transmission. For example, there may be a requirement for out of band transmission to be below a threshold value. This can be particularly useful when orthogonal frequency division multiplexing (OFDM) is in use.

In the example cost function above, the dependence upon out of band transmission is provided by:

$$\lambda_2 \sum_{n \notin N_u} \|Af_n\|^2$$

The optimization of the cost function can be solved using a greedy optimization algorithm. A greedy optimization algorithm treats each component of the cost function as independent and iteratively finds the optimized value for each component of the cost function.

The optimization finds an optimal A, where each element of A belongs to one of the constellation points 140 in the set χ. For example, A=S1+S2, where S1 and S2 are constellation points 132 in FIG. 3 and A is a constellation point 142 in FIG. 4

Figure 10:
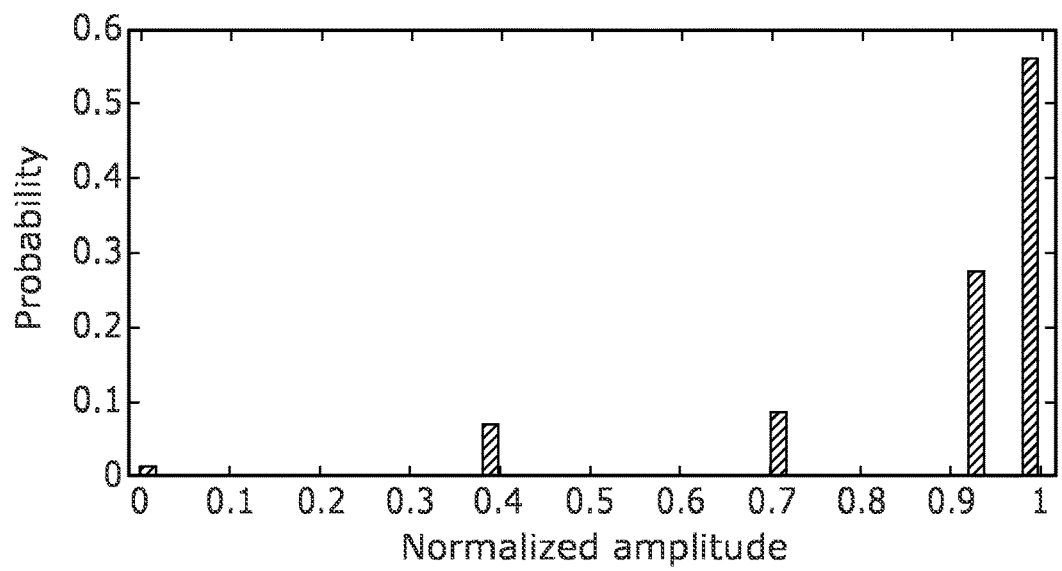
FIG. 10 shows another example embodiment of the subject matter described herein.

The consequences of using a properly specified cost function that balances decreasing transmission power while maintaining efficiency, can be seen in FIG. 10. FIG. 10 is a histogram of the signal constellation points 42 at any antenna 150. The outer, greater magnitude, constellation points 142 from outphasing are selected more often when compared with the inner constellation points. The outer constellation points have higher output power, and therefore higher efficiency than the inner constellation points.

Figure 11:
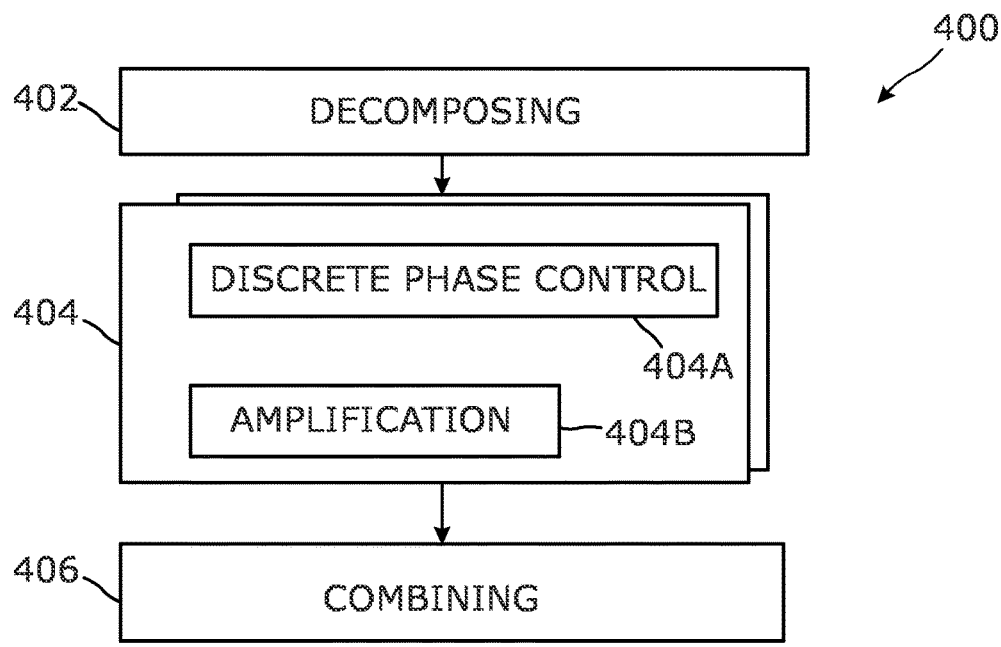
FIG. 11 shows another example embodiment of the subject matter described herein.

The multiple amplifiers $114_n$ are constant-envelope and therefore consume a fixed amount of power. Decreasing output power, while keeping the power consumed fixed reduces efficiency FIG. 11 illustrates an example of a method 400 as previously described. The method comprises:

at block 402, decomposing an input signal 101 to multiple substantially constant-envelope components {Sn};

at block 404, providing, for each substantially constant-envelope component Sn, discrete phase control and amplification; and at block 406, combining the substantially constant-envelope components {Sn} after separate discrete phase control and amplification.

The separate discrete phase control 404A and amplification 404B of each of the constant-envelope components {Sn} can occur contemporaneously in parallel.

As used in this application, the term 'circuitry' may refer to one or more or all of the following:

(a) hardware-only circuitry implementations (such as implementations in only analog and/or digital circuitry) and (b) combinations of hardware circuits and software, such as (as applicable):

(i) a combination of analog and/or digital hardware circuit(s) with software/firmware and (ii) any portions of hardware processor(s) with software (including digital signal processor(s)), software, and memory(ies) that work together to cause an apparatus, such as a mobile phone or server, to perform various functions and (c) hardware circuit(s) and or processor(s), such as a microprocessor(s) or a portion of a microprocessor(s), that requires software (e.g. firmware) for operation, but the software may not be present when it is not needed for operation.

This definition of circuitry applies to all uses of this term in this application, including in any claims. As a further example, as used in this application, the term circuitry also covers an implementation of merely a hardware circuit or processor and its (or their) accompanying software and/or firmware. The term circuitry also covers, for example and if applicable to the particular claim element, a baseband integrated circuit for a mobile device or a similar integrated circuit in a server, a cellular network device, or other computing or network device.

The blocks illustrated in the FIG. 11 may represent steps in a method and/or sections of code in a computer program. The illustration of a particular order to the blocks does not necessarily imply that there is a required or preferred order for the blocks and the order and arrangement of the block may be varied. Furthermore, it may be possible for some blocks to be omitted.

The precedingly described apparatus 100, system 200 and base station 300 comprise: decomposing means 110 for decomposing an input signal 101 to multiple substantially constant-envelope components S1, S2;

multiple outphasing paths $120_n$, wherein each outphasing path $120_n$ comprises means for:
  receiving one of the multiple substantially constant-envelope components S1, S2;
  modifying the received one of the multiple substantially constant-envelope components S1, S2 using a phase controller that enables discrete phase control in the outphasing path $120_n$;
  an amplifier $114_n$ in the outphasing path $120_n$; and
  combining means 116 for combining the modified multiple substantially constant-envelope components S1, S2.

Where a structural feature has been described, it may be replaced by means for performing one or more of the functions of the structural feature whether that function or those functions are explicitly or implicitly described.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one." or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example. Although embodiments have been described in the preceding paragraphs with reference to various examples, it should be appreciated that modifications to the examples given can be made without departing from the scope of the claims.

Features described in the preceding description may be used in combinations other than the combinations explicitly described above.

Although functions have been described with reference to certain features, those functions may be performable by other features whether described or not.

Although features have been described with reference to certain embodiments, those features may also be present in other embodiments whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer and exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

We claim:

1. An apparatus comprising:
   circuitry for non-linear precoding of an input signal in order to decompose the input signal to multiple substantially constant-envelope components;
   an outphasing path for each substantially constant-envelope component;
   a modulator configured to provide discrete phase control in each outphasing path;
   an amplifier in each outphasing path; and
   a combiner configured to combine output signals over-the-air from the outphasing paths.

2. The apparatus as claimed in claim 1, wherein the modulator in each outphasing path is configured to define, for the outphasing path, a constellation point in a constant envelope constellation diagram.

3. The apparatus as claimed in claim 2, wherein the modulator is configured to define, for each outphasing path, a constellation point in the constant envelope constellation diagram and thereby define a target constellation point in a non-constant-envelope constellation diagram for the output signal.

4. The apparatus as claimed in claim 1 wherein each outphasing path comprises a phase controller that enables discrete phase control in the outphasing path, wherein the phase controller is configured to phase modulate a carrier wave.

5. The apparatus as claimed in claim 1, wherein the amplifier in each outphasing path is a non-linear amplifier configured for amplification of the substantially constant-envelope component received by the outphasing path.

6. The apparatus as claimed in claim 1 wherein the combined output signals of the outphasing paths are provided to an antenna for transmission.

7. A system comprising
for each one of a plurality of antennas, an apparatus comprising:
  circuitry for non-linear precoding of an input signal in order to decompose the input signal to multiple substantially constant-envelope components;
  an outphasing path for each substantially constant-envelope component;
  a modulator configured to provide discrete phase control in each outphasing path;
  an amplifier in each outphasing path; and
  a combiner configured to combine output signals over-the-air from the outphasing paths, wherein the combined output signals of the outphasing paths are provided to a respective antenna for transmission.

8. The system as claimed in claim 7, wherein the circuitry for non-linear precoding is configured to control, for the respective antenna, discrete phase control in each outphasing path to define, for each outphasing path, a constellation point in a constant envelope constellation diagram and thereby define a target constellation point in a non-constant-envelope constellation diagram for each of the combined output signals provided to the respective antenna.

9. The system as claimed in claim 7, wherein the circuitry for non-linear precoding of the input signal is configured to decompose the input signal to multiple substantially constant-envelope components for all antennas.

10. The system as claimed in claim 7, comprising circuitry configured to optimize a cost function, across the plurality of antennas, to determine discrete phase control used for each outphasing path.

11. The system as claimed in claim 10, wherein the cost function is dependent upon total transmission power of the plurality of antennas and a measure of a difference between information intended to be received and information estimated to be received, as a consequence of providing the respective combined output signals of the outphasing paths to the respective antenna for transmission.

12. The system as claimed in claim 10, wherein the cost function is dependent upon efficiency.

13. The system as claimed in claim 10, wherein the cost function is additionally dependent upon interference.

14. The system as claimed in claim 8 embodied by a base station.

15. A method comprising:
non-linear precoding of an input signal to decompose the input signal to multiple substantially constant-envelope components directed along respective outphasing paths;
providing for each substantially constant-envelope component on a respective outphasing path, discrete phase control and amplification; and
combining the substantially constant-envelope components over-the-air after separate discrete phase control and amplification on the outphasing paths.

16. The method as claimed in claim 15, wherein providing the discrete phase control comprises defining, for the respective outphasing path, a constellation point in a constant envelope constellation diagram.

17. The method as claimed in claim 16, wherein defining, for the respective outphasing path, the constellation point in the constant envelope constellation diagram comprises defining a target constellation point in a non-constant-envelope constellation diagram for the output signal.

18. The method as claimed in claim 15 wherein providing the discrete phase control comprises phase modulating a carrier wave.

19. The method as claimed in claim 15, wherein providing the amplification in the outphasing path comprises providing non-linear amplification of the substantially constant-envelope component received by the respective outphasing path.

20. The method as claimed in claim 15, further comprising providing the combined output signals of the outphasing paths to an antenna for transmission.

* * * * *